US006359487B1

(12) United States Patent
Heightley et al.

(10) Patent No.: US 6,359,487 B1
(45) Date of Patent: Mar. 19, 2002

(54) SYSTEM AND METHOD OF COMPENSATING FOR NON-LINEAR VOLTAGE-TO-DELAY CHARACTERISTICS IN A VOLTAGE CONTROLLED DELAY LINE

(75) Inventors: John Heightley; Jon Allan Faue, both of Colorado Springs, CO (US)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/541,876

(22) Filed: Apr. 3, 2000

(51) Int. Cl.[7] ............................................... H03H 11/26
(52) U.S. Cl. ..................... 327/276; 327/149; 327/153; 327/161; 327/271; 375/376; 331/DIG. 2
(58) Field of Search .................................. 327/141, 155, 327/156, 158, 161, 149, 153, 261, 284, 276, 264, 269–272; 365/189.07, 233; 375/371, 373, 375, 376; 331/25, 14, DIG. 2

(56) References Cited

U.S. PATENT DOCUMENTS 5,790,612 A * 8/1998 Chengson et al. .......... 375/373
6,087,868 A * 7/2000 Millar ........................ 327/156

OTHER PUBLICATIONS

A Low–Power CMOS Time–to–Digital Converter, IEEE Journal of Solid–State Circuits, vol. 30, No. 9, Raisanen–Routsalainen et al., 9/95.
Clock Buffer Chip with Multiple Target Automatic Skew Compensation, IEEE Journal of Solid–State Circuits, vol. 30, No. 11, Watson, Jr. & Iknaian, 11/95.
A 64–Mbit, 640–MByte/s Bidirectional Data Strobed, Double–Data–Rate SDRAM with a 40–mW DLL for a 256–MByte Memory System, IEEE Journal of Solid–State Circuits, vol. 33, No. 11, Kim et al., 11/98.
The Delay Vernier Pattern Generation Technique, IEEE Journal of Solid–State Circuits, vol. 32, No. 4, Moyer et al. 4/97.

A Portable Clock Multiplier Generator Using Digital CMOS Standard Cells, IEEE Journal of Solid–State Circuits, vol. 31, No. 7, Combes et al., 7/96.
A 250–622 MHz Deskew and Jitter–Suppressed Clock Buffer Using Two–Loop Architecture, IEEE Journal of Solid–State Circuits, vol. 31, No. 4, Tanoi, 4/96.
An Integrated High Resolution CMOS Timing Generator Based on an Array of Delay Locked Loops, IEEE Journal of Solid–State Circuits, vol. 31, No. 7, Christainsen, 7/96.
A 800MB/s 72Mb SLDRAM with Digitally–Calibrated DLL, IEEE Journal of Solid–State Circuits Conference/Session 24/Paper WP24.3, Paris et al., 6/99.

* cited by examiner

*Primary Examiner*—Timothy P. Callahan
*Assistant Examiner*—Minh Nguyen
(74) *Attorney, Agent, or Firm*—William J. Kubida; Kent A. Lembke; Hogan & Hartson LLP

(57) ABSTRACT

A system and method of compensating for non-linear voltage-to-delay characteristics in a voltage controlled delay line such as those used in delay-locked loop ("DLL") circuits in integrated circuit ("IC") devices such as double data rate ("DDR") dynamic random access memory ("DRAM"), static random access memory ("SRAM"), processors and other IC devices. The technique renders the incremental changes for each correction to the control voltages to the voltage controlled delay line a function of the control voltage itself. The change in the control voltage becomes smaller as the control voltage gets lower thereby effectively precluding over-correction and excessive jitter. Since the smallest corrections to be made will occur when the control voltage is much lower than its initial value, the majority of the corrections made in moving from the initialization point to the final lock point in the DLL loop will be much larger than the final corrections thereby resulting in only minimally slower locking times than would otherwise be the case. The changes in delay become inherently smaller if the lock point is at a higher VR value.

21 Claims, 6 Drawing Sheets

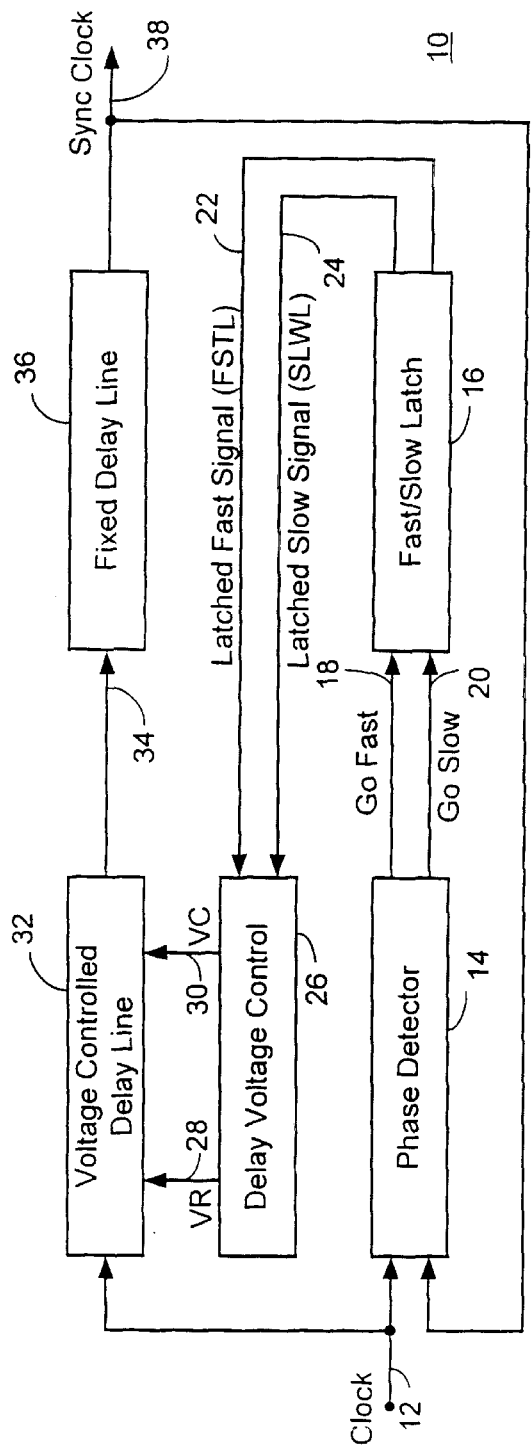
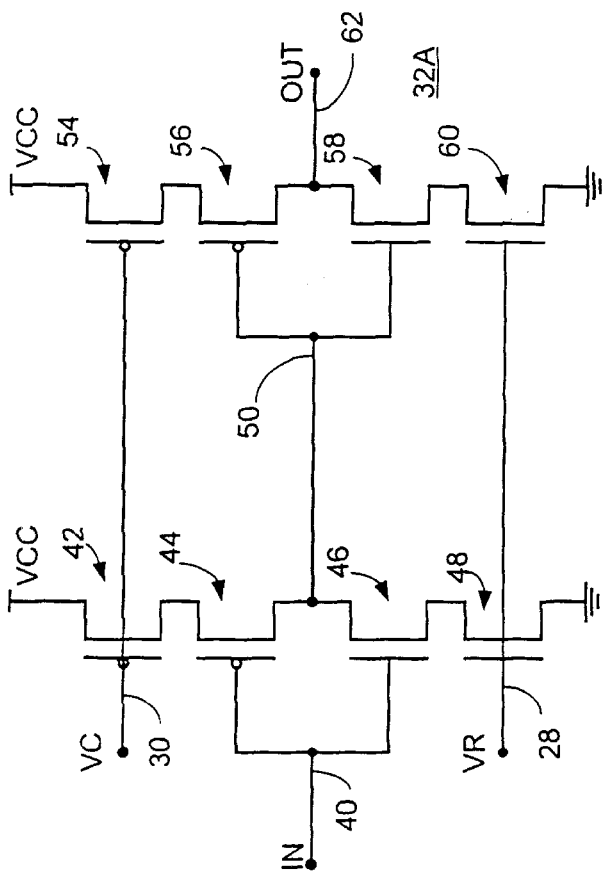
Fig. 1
Fig. 2

SYSTEM AND METHOD OF COMPENSATING FOR NON-LINEAR VOLTAGE-TO-DELAY CHARACTERISTICS IN A VOLTAGE CONTROLLED DELAY LINE

CROSS REFERENCE TO RELATED PATENT APPLICATIONS

The present invention is related to the subject matter disclosed in U.S. patent applications Ser. No. 09/542,509 for: "Low Power Consumption Integrated Circuit Delay Locked Loop and Method of Controlling the Same" and 09/542,511 for: "System and Method for Eliminating Pulse Width Variations in Digital Delay Lines", both filed on even date herewith and assigned to Mosel Vitelic, Inc., assignee of the present invention, the disclosures of which are specifically incorporated herein by this reference.

BACKGROUND OF THE INVENTION

The present invention relates, in general, to the field of systems and methods of compensating for non-linear voltage-to-delay characteristics in a voltage controlled delay line. More particularly, the present invention relates to a technique for compensating for non-linear voltage-to-delay characteristics in a voltage controlled delay line of especial utility in conjunction with a delay locked loop ("DLL") circuit such as those utilized in double data rate ("DDR") dynamic random access memory ("DRAM") devices, static random access memory ("SRAM") devices, integrated circuit ("IC") processors and other IC devices.

DDR DRAM device functionality is specified by a Joint Electron Devices Engineering Counsel ("JEDEC") standard and such memories are able to achieve this effective doubling of the device's bandwidth by inclusion of DLL circuitry to achieve synchronization of data accesses at a point in time to enable the reading of data on both the rising and falling edges of each clock cycle.

In such DLL circuits, a phase detector is utilized to determine the relative phase between two clock signals, such as the system clock and synchronization ("sync") clock signal in a DDR memory device. In any event, the DLL is operational to adjust the control voltages (which, in a complementary metal oxide semiconductor ("CMOS") implementation may be denominated "VR" for the control of N-channel devices and "VC" for control of P-channel devices) applied to a voltage controlled delay line until the two clock signals are perfectly in phase. Generally, a fast/slow latch circuit is used to generate a pulse on one of the DLL circuit latched signal lines when a delay adjustment is required to implement small adjustments to the control voltages.

In a conventional DLL circuit, the relationship between VR (and VC) and the delay through the voltage controlled delay line is very non-linear due at least in part to the non-linear gate-to-source characteristics of the transistors involved. For example, at low values of VR (which corresponds to relatively long delays through the delay line) the change in delay can be much larger for a given change in VR than is the case with relatively higher values of VR. On the other hand, if the increments of change in VR are made substantially constant, this can lead to significantly more "jitter" (the cycle by cycle changes in frequency of the signal) when the delay is long because the changes in VR then result in too much change in the delay.

Further, depending on the frequency of the DLL clock, the delay through the delay line can be one or multiple clock periods long. Consequently, the phase detector may actually be initiating changes in VR before the effect of a previous change is fully manifested in the sync clock phase. This lag effect then further adds to the jitter and, while implementing very small fixed increments of change in VR will somewhat ameliorate this problem, the phase locking time of the DLL circuit will then be made too long.

SUMMARY OF THE INVENTION

Disclosed herein is a system and method of compensating for non-linear voltage-to-delay characteristics in a voltage controlled delay line which effectively renders the incremental changes in the control voltages (e.g. VR) for each correction a function of the control voltage itself. In this manner, the change in the control voltage becomes smaller as the control voltage gets lower thereby effectively precluding over-correction and excessive jitter. Since the smallest corrections to be made will occur when VR is much lower than its initial value, the majority of the corrections made in moving from the initialization point to the final lock point in the DLL loop will be much larger than the final corrections thereby resulting in only minimally slower locking times than would otherwise be the case. Notwithstanding, it should also be noted that the changes in delay become inherently smaller if the lock point is at a higher VR value.

In accordance with the technique disclosed herein, the delay in the DLL loop is a function of the control voltage VR and this delay monotonically increases as the voltage level of VR decreases from its maximum value to its minimum value. Concomitantly, the incremental changes made in the voltage level of VR as a function of VR (the step size of VR=f(VR)) to effectuate the changes in delay monotonically decrease as the voltage level of VR decreases.

Particularly disclosed herein is a method of compensating for non-linear voltage-to-delay characteristics in a voltage controlled delay line and a means for implementing the method which comprises the steps of: providing at least one control voltage having an initial level thereof to the voltage controlled delay line; implementing a series of changes in the control voltage level; and controlling the series of changes in the control voltage level such that a difference between successive ones of the control voltage levels increase as said control voltage levels become greater and decrease as said control voltage levels become lower.

Also particularly disclosed herein is a circuit comprising a voltage controlled delay line and a delay voltage control circuit for supplying at least one control voltage to the voltage controlled delay line, the delay voltage control circuit being operative to control a level of the at least one control voltage such that a difference between successive levels in the control voltage level increase as said control voltage levels become greater and decrease as said control voltage levels become lower.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified logic block diagram of a delay locked loop ("DLL") circuit for use, for example, in a double data rate ("DDR") dynamic random access memory ("DRAM") device;

FIG. 2 is a schematic diagram of a voltage controlled delay inverter circuit forming a portion of the voltage controlled delay line circuit of the DLL circuit of FIG. 1;

DESCRIPTION OF A PREFERRED EMBODIMENT

Figure 3A:
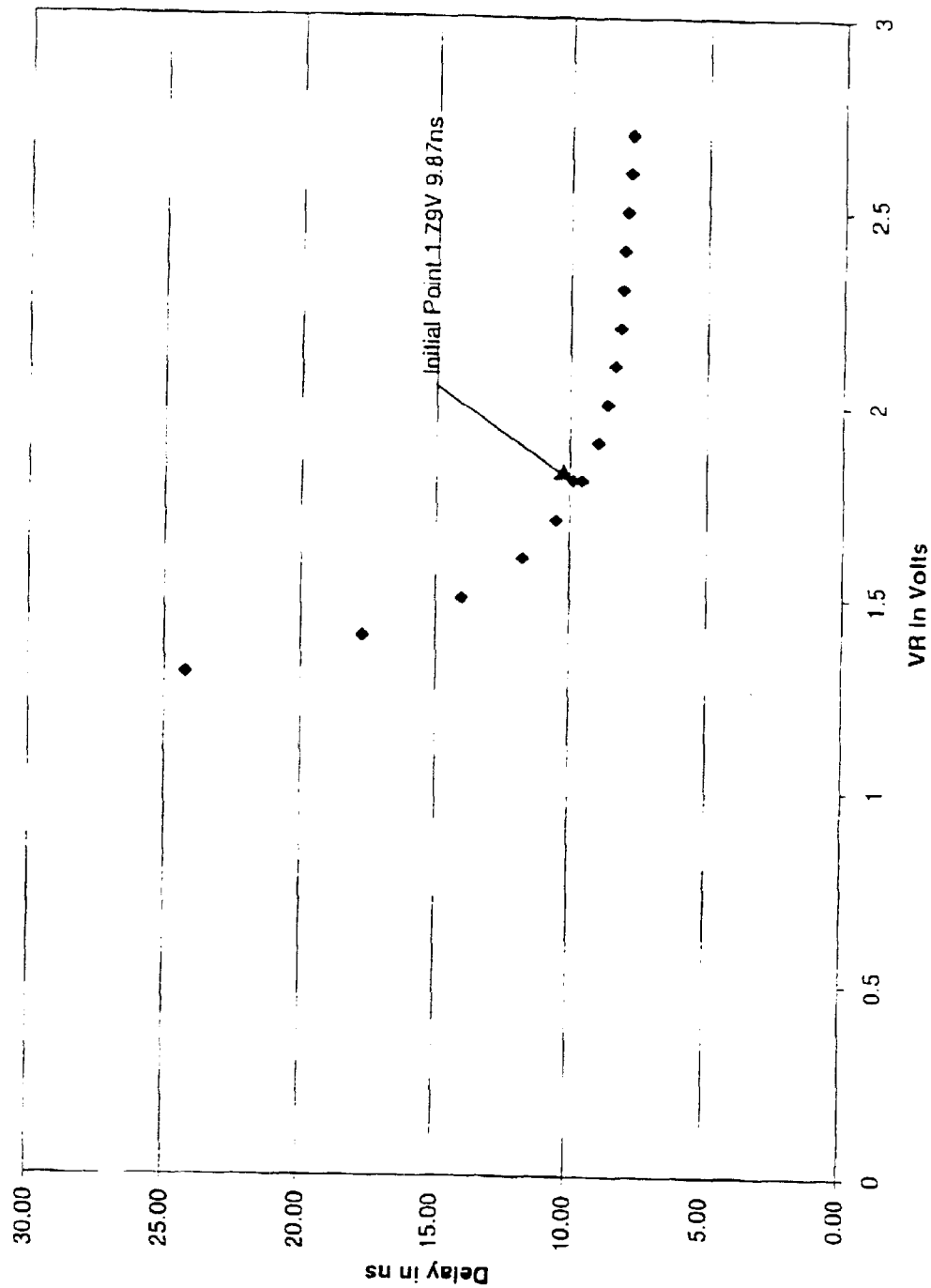
FIG. 3A is a representative plot of delay line delay (in nanoseconds "ns" at 2.7 volts and −15° C.) vs. the signal VR (in volts) input to the voltage controlled delay line circuit of the DLL circuit of FIG. 1 and illustrating the significantly non-linear relationship between VR and the delay through the delay line.

With reference now to FIG. 1, a simplified logic block diagram of a delay locked loop ("DLL") circuit 10 is shown for use, for example, in a double data rate ("DDR") dynamic random access memory ("DRAM") device. The DLL circuit 10 receives a clock signal input on line 12 forming one input to a phase detector 14. The phase detector 14 provides inputs to a fast/slow latch circuit 16 in the form of a "Go Fast" signal on line 18 and a "Go Slow" signal on line 20.

In turn, the fast/slow latch circuit 16 provides a latched fast signal ("FSTL") on line 22 and latched slow signal ("SLWL") on line 24 for input to a delay voltage control circuit 26. The delay voltage control circuit 26 provides a VR signal on output line 28 and VC signal on output line 30 for input to a voltage controlled delay line circuit 32. The voltage controlled delay line circuit 32 supplies a signal on line 34 for input to a fixed delay line circuit 36 which provides a synchronous ("sync") clock output on line 38 which is also fed back to a second input of the phase detector 14.

In operation, the phase detector 14 determines the relative phase between the clock signal on line 12 and the sync clock signal on line 38 and adjusts the control voltages VC and VR going to the voltage controlled delay line circuit 32 until the two clock signals are in phase. The fast/slow latch circuit 16 generates a pulse on one of the latched signal lines 22, 24 when a delay adjustment is required that is used to make small adjustments to the control voltages VC and VR.

With reference additionally now to FIG. 2, a schematic diagram of a voltage controlled delay inverter circuit 32A is illustrated forming a portion of the voltage controlled delay line circuit 32 of the DLL circuit 10 of FIG. 1. In a particular embodiment of the present invention for use, for example, in a 64 Meg DDR DRAM memory device, twenty series connected voltage control delay inverter circuits 32A may be used to form the voltage controlled delay line circuit 32 while twenty four fixed delay circuits may be used to form the fixed delay line circuit 36.

Each of the voltage controlled delay inverter circuits 32A receives the VC and VR control voltage signals as inputs on lines 30 and 28 respectively. An input to each successive one of the circuits 32A is received on line 40. The circuits 32A comprise a pair of series connected CMOS transistors strings comprising P-channel transistors 42 and 44 coupling a supply voltage ("VCC") to circuit ground through N-channel transistors 46 and 48. Similarly, P-channel transistors 54 and 56 couple VCC to circuit ground through N-channel transistors 58 and 60.

The VC signal on line 30 is supplied to the gate terminals of P-channel transistors 42 and 54 while the VR signal on line 28 is supplied to the gate terminals of N-channel transistors 48 and 60. The input line 40 is coupled to the common connected gate terminals of P-channel transistor 44 and N-channel transistor 46. Node 50 intermediate P-channel transistor 44 and N-channel transistor 46 is coupled to the common connected gate terminals of P-channel transistor 56 and N-channel transistor 58. The output of the circuit 32A is taken at a node 62 intermediate P-channel transistor 56 and N-channel transistor 58.

With reference additionally now to FIG. 3A, a representative plot of delay line delay (in nanoseconds) vs. the control signal VR voltage input to the voltage controlled delay line circuit 32 of a DLL circuit is shown. This graphical illustration shows the significantly non-linear relationship between the signal VR and the delay through the total delay line of the DLL circuit 10. Since the signal VC is dependent on the signal VR and has a one-to-one correspondence therewith, it is not necessary to illustrate that signal separately.

Figure 3B:
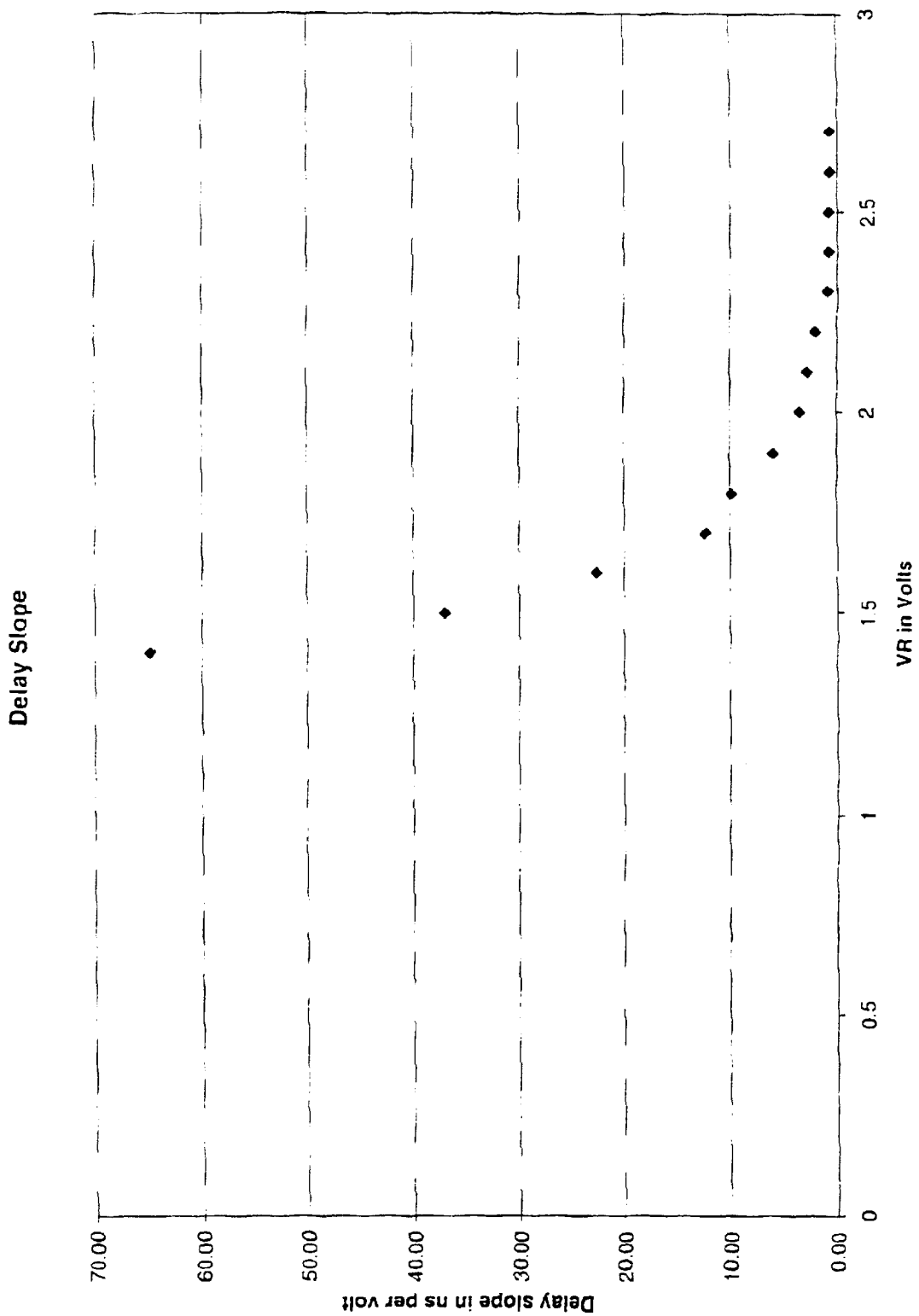
FIG. 3B is another representative plot showing the delay slope (Δdelay/ΔVR in ns/volt) vs. VR (in volts) illustrative of the fact that at low values of VR (corresponding to long delays through the delay line) the change in delay is much larger for a given change in VR than it is at relatively higher values of VR.

With reference additionally now to FIG. 3B, another representative plot is presented showing the delay slope (change in delay/change in VR) vs. VR (in volts) and illustrative of the fact that at low values of VR (corresponding to long delays through the delay line) the change in delay is much larger for a given change in VR than it is at relatively higher values of VR in a DLL circuit.

If the increments of change in VR are made constant, it can lead to significantly more jitter when the delay is long because the changes in VR result in too much change in the delay. Depending on the frequency of the DLL clock, the delay through the delay line can be one clock period long or multiple clock periods long. The phase detector may, therefore, be initiating changes in VR before the effect of a previous change is fully manifested in the sync clock signal phase. This lag effect further adds to the jitter. Very small fixed increments of change in VR will ameliorate this problem, but the locking time of the DLL circuit will then be too long.

In accordance with the techniques disclosed herein, the problems associated with the non-linear voltage-to-delay characteristics of a DLL circuit 10 may be overcome by making the increment of VR for each correction a function of VR such that the change in VR gets smaller as VR gets lower, thus avoiding over correction and excessive jitter. Since the smallest corrections occur when VR is much lower than its initial value, the bulk of the corrections made in moving from the initialization point to a final lock point will be much larger than the final corrections. The locking time will, therefore, be only slightly slower than would otherwise be the case. Notwithstanding, it should also be noted that the changes in delay become inherently smaller if the lock point is at a higher VR value.

Figure 4A:
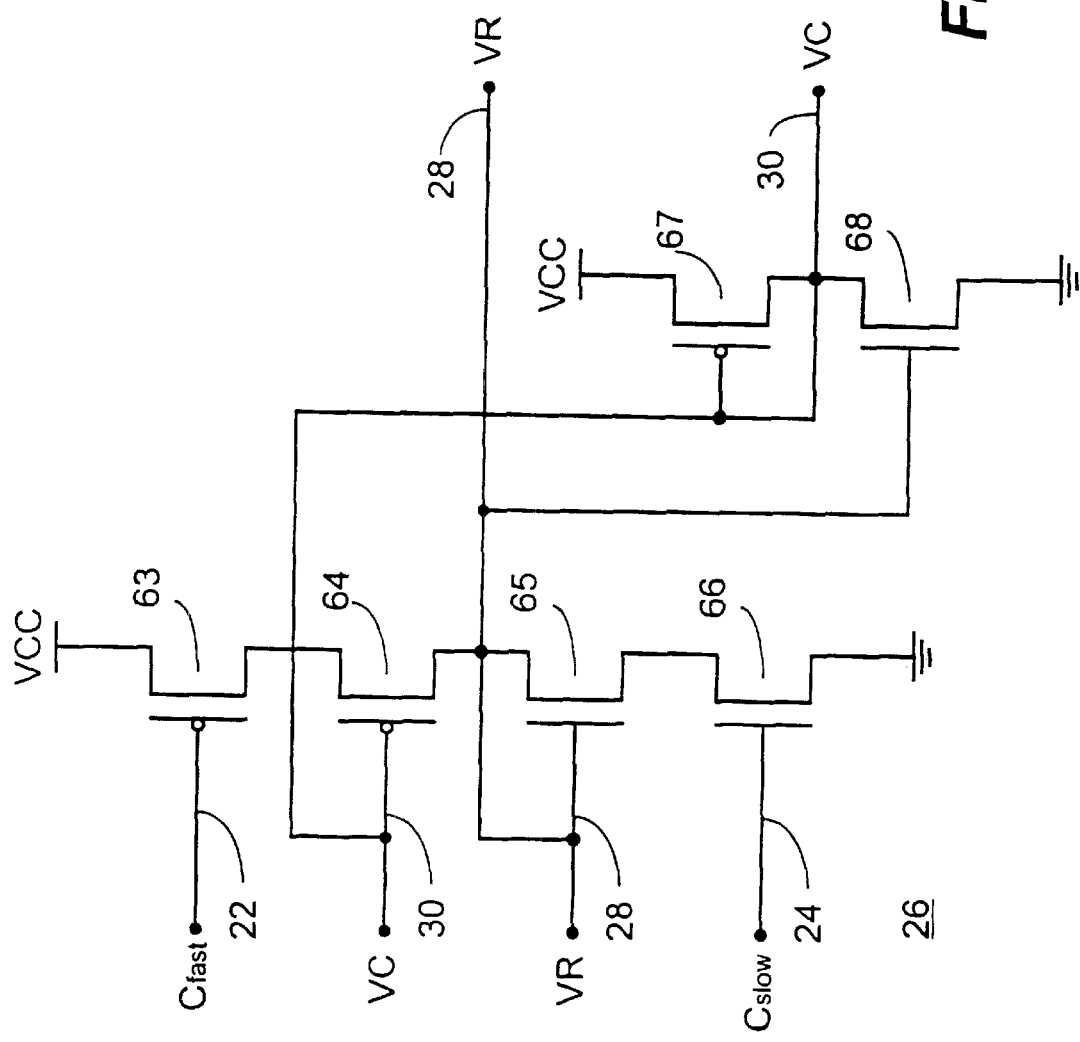
FIG. 4A is a simplified schematic diagram of a delay voltage control circuit in accordance with the present invention for generating the VR and VC signals input to a voltage controlled delay line circuit.

With reference additionally now to FIG. 4A, a simplified schematic diagram of a delay voltage control circuit 26 in accordance with the present invention is shown for generating the VR and VC signals on lines 28 and 30 respectively for input to a voltage controlled delay line circuit 32 (FIG. 1). The delay voltage control circuit 26 receives "fast" and "slow" control signals (herein designated as $C_{fast}$ and $C_{slow}$) which correspond to the FSTL and SLWL signals (FIG. 1) on lines 22 and 24 respectively from the fast/slow latch 16.

The circuit 26 comprises, in pertinent part, series connected P-channel transistors 63 and 64 with N-channel transistors 65 and 66 coupled between VCC and circuit ground. The $C_{fast}$ signal on line 22 is applied to the gate terminal of P-channel transistor 63 while the $C_{slow}$ signal on line 24 is coupled to the gate of N-channel transistor 66. The VR and VC signals on lines 28 and 30 are respectively coupled to the gate terminal of N-channel transistor 65 and P-channel transistor 64 as shown. Series connected P-channel transistor 67 and N-channel transistor 68 are also coupled between VCC and circuit ground with the gate terminal of P-channel transistor 67 being coupled to VC line 30 as well as to the node intermediate P-channel transistor 67 and N-channel transistor 68. The VR line 28 is coupled to the node intermediate P-channel transistor 64 and N-channel transistor 65 as well as to the gate terminal of N-channel transistor 68.

In accordance with the technique disclosed herein, the delay in the DLL loop 10 (FIG. 1) is a function of the control voltage VR and this delay monotonically increases as the voltage VR decreases from its maximum value to its minimum value. Through the use of circuit 26, the incremental changes made in the voltage level of VR as a function of VR (the step size of VR=f(VR)) to effectuate the changes in delay monotonically decrease as the voltage level of VR decreases.

Figure 4B:
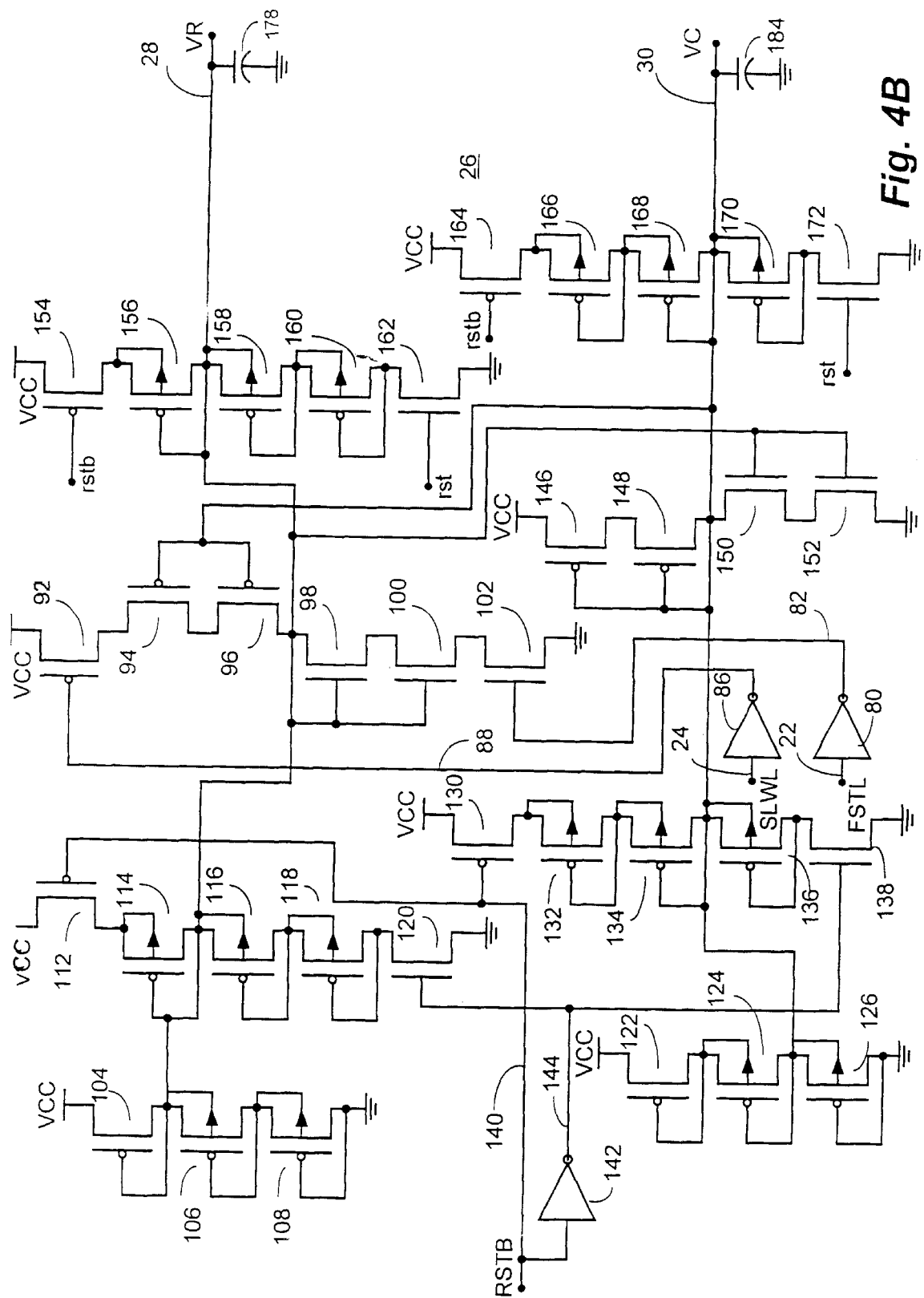
FIG. 4B is a representative schematic diagram of a delay voltage control circuit in accordance with an actual implementation of the present invention for generating the VR and VC signals input to the voltage controlled delay line circuit of the DLL circuit of FIG. 1.

With reference additionally now to FIG. 4B, a representative schematic diagram of a delay voltage control circuit 26 in accordance with an actual implementation of the present invention is illustrated for generating the VR and VC signals input to the voltage controlled delay line circuit 32 of the DLL circuit 10 of FIG. 1. The circuit 26, as shown, receives the FSTL and SLWL signals on lines 22 and 24 respectively from the fast/slow latch circuit 16 and generates the VR and VC signals on lines 28 and 30.

The delay voltage control circuit includes a first inverter 80 coupled to receive the FSTL signal on line 22 and the inverter 80 provides an output signal on line 82. In like manner, a second inverter 86 is coupled to receive the SLWL signal on line 24 and the inverter 86 provides an output signal on line 88. A number of series connected transistors couple VCC to circuit ground including P-channel transistors 92, 94 and 96 in series with N-channel transistors 98, 100 and 102. The signal on line 82 is coupled to the gate of N-channel transistor 102 while the signal on line 88 is applied to the gate of P-channel transistor 92. It should be noted that P-channel transistors 94 and 96 and N-channel transistors 98 and 100 may be replaced by larger individual P-channel and N-channel transistors respectively.

A number of series connected P-channel transistors 104, 106 and 108 are connected between VCC and circuit ground having their gates coupled to another of their terminals form a voltage divider circuit with a node defining line 28 between P-channel transistors 104 and 106. This node is, in turn, coupled to an additional series connected transistor string comprising P-channel transistors 112, 114, 116, 118 and N-channel transistor 120 coupled between VCC and circuit ground. The gate of P-channel transistor 112 is coupled to receive a RSTB (reset bar) signal on line 140 while the gate of N-channel transistor 120 is coupled to receive the inverse of that signal applied through inverter 142 on line 144. The gates of P-channel transistors 114, 116 and 118 are coupled to another one of their terminals as indicated.

Similarly, a number of series connected P-channel transistors 122, 124 and 126 are also connected between VCC and circuit ground having their gates coupled to another of their terminals form a voltage divider circuit with a node defining line 30 between P-channel transistors 122 and 124. This node is, in turn, coupled to an additional series connected transistor string comprising P-channel transistors 130, 132, 134, 136 and N-channel transistor 138 coupled between VCC and circuit ground. The gate of P-channel transistor 130 is coupled to receive the RSTB signal on line 140 while the gate of N-channel transistor 138 is coupled to receive the inverse of that signal applied through inverter 142 on line 144. The gates of P-channel transistors 132, 134 and 136 are coupled to another one of their terminals as indicated.

Line 30 is also coupled to a node intermediate P-channel transistor 148 and N-channel transistor 150 of a series connected transistor string comprising P-channel transistors 146 and 148 with N-channel transistors 150 and 152 coupled between VCC and circuit ground. As before, P-channel transistors 146 and 148 as well as N-channel transistors 150 and 152 may be replaced by larger individual P-channel and N-channel devices respectively. The gate terminals of P-channel transistors 146 and 148 are coupled to line 30 while the gate terminals of N-channel transistors 150, 152 are coupled to line 28. The gate terminals of P-channel transistors 94, 96 are coupled to line 30 while the gate terminals of N-channel transistors 98, 100 are coupled to line 28.

An additional series connected transistor string comprising P-channel transistors 154, 156, 158 and 160 with N-channel transistor 162 is coupled between VCC and circuit ground. The gates of P-channel transistors 156, 158 and 160 are coupled to another of their terminals as indicated while the gate of P-channel transistor 154 receives a "rstb" (reset bar) signal and the gate of N-channel transistor 162 receives a "rst" signal. Line 28 is coupled to a node intermediate P-channel transistors 156 and 158.

In like manner, a further series connected transistor string comprising P-channel transistors 164, 166, 168 and 170 with N-channel transistor 172 is coupled between VCC and circuit ground. The gates of P-channel transistors 166, 168 and 170 are coupled to another of their terminals as indicated while the gate of P-channel transistor 164 receives the "rstb" signal and the gate of N-channel transistor 162 receives the "rst" signal. Line 30 is coupled to a node intermediate P-channel transistors 168 and 170. A capacitor 178 couples line 28 to circuit ground while a capacitor 184 also couples line 28 to circuit ground.

Figure 5:
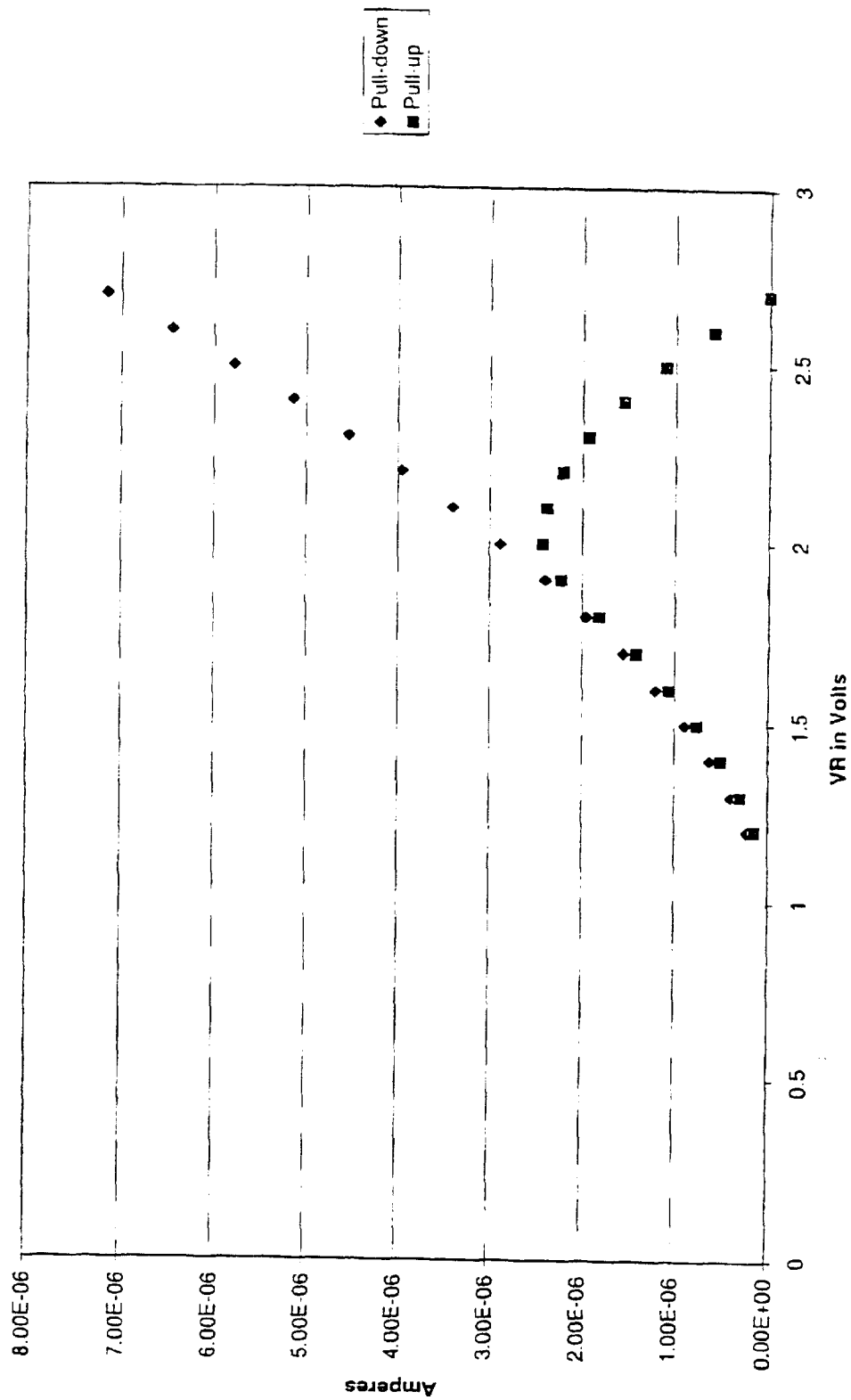
FIG. 5 is an additional representative plot of the pull-up and pull-down currents (in amperes) on the nodes VR and VC shown in the preceding figures as a function of the signal VR (in volts) for a voltage controlled delay line implemented utilizing the techniques of the present invention.

In operation, the delay voltage control circuit 26 functions such that the signal VR is adjusted by adding or subtracting small amounts of charge on the capacitance tied to line 28 (capacitor 178) each time either a FSTL positive pulse occurs or a SLWL positive pulse occurs respectively. N-channel transistor 102 and P-channel transistor 92 are effectively on-off switching devices and have negligible effect on the charge transfer. The size of the corrections is determined by the width of the FSTL and SLWL pulses and by the magnitude of the current flow through P-channel transistors 94 and 96 (for a positive correction, i.e. to go faster) and N-channel transistors 98, 100 (for a negative correction, i.e. to go slower). As the signal VR decreases, VC increases and the current flow through these transistors decreases (as seen in FIG. 5), thus decreasing the magnitude of the corrections. The remainder of the circuitry of circuit 26 is required for setting the initial values of the signals VR and VC and for generating VC from VR. The width of the signals FSTL and SLWL is wide when the two clocks are significantly out of phase and gets narrower as the clocks approach closer to being in phase thus helping the fast locking of the DLL circuit 10.

In the particular embodiment disclosed, P-channel transistor 92 may have a channel width-to-length ("W/L") ratio of 2:1 microns while N-channel transistor 102 has a W/L ratio of 1:1 microns. P-channel transistors 94, 96 may both have a channel width of substantially 0.9 microns and a channel length of 5.5 microns. N-channel transistors 98, 100 may have W/L ratios of 0.9:12 microns. Capacitor 178 has a value of about 58 picofarads ("pf") while capacitor 184 has a value of about 64 pf.

With reference additionally now to FIG. 5, an additional representative plot of the pull-up and pull-down currents (in amperes) as a function of the signal VR is shown. As illustrated, the pull-up current rolls off at the upper end of the range of the VR signal because the P-channel transistors 94, 96 of the circuit 26 do not have sufficient drain-to-source voltage to remain in saturation. This occurs in the range of VR for which the delay is nearly saturated at its minimum and it does not significantly impact the performance.

While there have been described above the principles of the present invention in conjunction with specific circuitry and applications it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A circuit comprising:
   a voltage controlled delay line configured to receive a system clock signal and to output a synchronization clock signal by applying a delay to said system clock signal; and
   a delay voltage control circuit for supplying a first and a second control voltage to said voltage controlled delay line to control said applying a delay by said voltage controlled delay line, said delay voltage control circuit including a correction magnitude circuit operative to control a level of said first control voltage such that a difference between successive levels in said first control voltage level increases as said first control voltage levels become greater and decreases as said first control voltage levels become lower;
   wherein the correction magnitude circuit is configured to control the level of the first control voltage and the difference between the successive levels based on a magnitude of current flowing through a correction portion including a control element for controlling the magnitude of the current flowing therethrough and wherein the control element operates in response to a feedback signal comprising the level of the first control voltage to decrease the magnitude of the current flowing as the level of the first control voltage decreases and to increase the magnitude of the current flowing as the level of the first control voltage increases, thereby controlling the difference as a function of the level of the first control voltage.

2. The circuit of claim 1 wherein said delay voltage control circuit is operative to control said level of said first control voltage such that said difference between successive levels becomes smaller as said first control voltage is reduced from an initial level thereof.

3. The circuit of claim 2 wherein said delay voltage control circuit is further operative to control said level of said first control voltage such that said difference between successive levels becomes greater as said first control voltage is increased from a lower level thereof toward said initial level thereof.

4. The circuit of claim 1 further comprising:
   a phase detector for receiving said system and synchronization clock signals and producing an output signal indicative a phase relationship between said system and synchronization clock signals;
   a latch circuit coupled to receive said output signal from said phase detector and producing a fast/slow signal for input to said delay voltage control circuit, said voltage controlled delay line providing said synchronization clock signal for input to said phase detector.

5. The circuit of claim 4 further comprising:
   a fixed delay line circuit coupled to said voltage controlled delay line for providing said synchronization clock signal for input to said phase detector.

6. The circuit of claim 4 wherein said phase detector, said latch circuit, said delay voltage control circuit and said voltage controlled delay line comprise a delay locked loop circuit.

7. The circuit of claim 6 wherein said delay locked loop circuit is integrated with a DDR DRAM.

8. The circuit of claim 1, wherein the second control voltage is generated by the delay voltage control circuit from the first control voltage such that a level of said second control voltage decreases and increases inversely to said level of said first control voltage.

9. The circuit of claim 1, wherein the first control voltage controls N-channel devices in said voltage controlled delay line and the second control voltage controls P-channel devices in said voltage controlled delay line.

10. The circuit of claim 1, wherein the level of the first control voltage is decreased by the correction magnitude circuit in response to a decrease in the magnitude of the current flowing in the correction portion.

11. A method of compensating for non-linear voltage-to-delay characteristics in a voltage controlled delay line, said method comprising:
   receiving a system clock signal at the voltage controlled delay line;
   providing a first and a second control voltage to said controlled delay line, wherein the providing includes controlling a level of the first control voltage such that a difference between successive levels in the first control voltage level increases as the first control voltage levels become greater and decreases as the first control voltage levels become lower; and creating a synchronization clock signal by applying a delay to the system clock signal, the delay being controlled by the levels of the first and second control voltages;

wherein the controlling of the first control voltage level is performed based on a magnitude of current flowing through a correction magnitude circuit and includes controlling the magnitude of the current flowing in response to receiving a feedback signal comprising the level of the first control voltage, the controlling comprising decreasing the magnitude of the current flowing as the level of the first control voltage decreases and increasing the magnitude of the current flowing as the level of the first control voltage increases.

12. A circuit for compensating for non-linear voltage-to-delay characteristics in a voltage controlled delay line, said circuit comprising:

means for providing at least one control voltage at a level thereof to said voltage controlled delay line;

means for implementing a series of changes in said control voltage level; and means for controlling said series of changes in said control voltage level such that a difference between successive ones of said control voltage levels increases as said control voltage levels become greater and decreases as said control voltage levels become lower.

13. The circuit of claim 12 wherein said means for controlling said series of changes in said control voltage level comprises:

means for making said difference between successive ones of said control voltage levels a function of said control voltage.

14. The circuit of claim 13 wherein said means for controlling said series of changes in said control voltage level comprises:

means for controlling said series of changes in said control voltage level such that the difference between successive ones of said control voltage levels becomes smaller as said control voltage is reduced from an initial level.

15. The circuit of claim 14 wherein said means for controlling said series of changes in said control voltage level comprises:

means for controlling said series of changes in said control voltage level such that the difference between successive ones of said control voltage levels becomes greater as said control voltage is increased from a lower level thereof toward said initial level.

16. The circuit of claim 13 wherein said means for controlling said series of changes in said control voltage level comprises:

means for controlling said series of changes in said control voltage level such that the difference between successive ones of said control voltage levels becomes smaller as said control voltage is decreased from an initial level.

17. The circuit of claim 16 wherein said means for controlling said series of changes in said control voltage level comprises:

means for controlling said series of changes in said control voltage level such that the difference between successive ones of said control voltage levels becomes greater as said control voltage is decreased from a higher level thereof toward said initial level.

18. A circuit for compensating for non-linear voltage-to-delay characteristics in a voltage controlled delay line, said circuit receiving at least one fast/slow input signal comprising:

a delay voltage control circuit for receiving said at least one fast/slow input signal and producing at least one control voltage to said voltage controlled delay line in response thereto, said delay voltage control circuit operative to control a level of said at least one control voltage such that a difference between successive levels in said control voltage level increases as said control voltage levels become greater and decreases as said control voltage levels become lower, wherein said at least one fast/slow input signal comprises separate "fast" and "slow" input signals and wherein said delay voltage control circuit comprises:

first, second, third and fourth series coupled switching devices having a first circuit node thereof and coupled between a supply voltage line and a reference voltage line, each of said series coupled switching devices including a control terminal thereof, said separate "fast" and "slow" input signals being respectively coupled to said control terminal of said first and fourth switching devices and said control terminal of said third switching device being coupled to said first circuit node intermediate said second and third switching devices to provide said at least one control voltage; and fifth and sixth series coupled switching devices having a second circuit node therebetween and coupled between said supply voltage line and said reference voltage line, each of said fifth and sixth switching devices including a control terminal thereof, said control terminal of said sixth switching device being coupled to said first circuit node to provide a first control voltage and said control terminal of said fifth switching device being coupled to said control terminal of said second switching device and to said second circuit node to provide a second control voltage.

19. The circuit of claim 18 wherein said first, second, third, fourth, fifth and sixth switching devices are MOS transistors.

20. The circuit of claim 19 wherein said first, second and fifth switching devices comprise P-channel MOS transistors and said third, fourth and sixth switching devices comprise N-channel MOS transistors.

21. The circuit of claim 19 wherein as said at least one control voltage decreases, a gate-to-source voltage of said third switching device decreases.

\* \* \* \* \*